United States Patent
Varricchione et al.

(10) Patent No.: US 8,467,254 B2
(45) Date of Patent: Jun. 18, 2013

(54) MEMORY APPARATUS

(75) Inventors: Jason Varricchione, Williston, VT (US); Stephen Potvin, Winooski, VT (US)

(73) Assignee: Nanya Technology Corporation, Taoyuan (TW)

( * ) Notice: Subject to any disclaimer, the term of this patent is extended or adjusted under 35 U.S.C. 154(b) by 129 days.

(21) Appl. No.: 13/244,609

(22) Filed: Sep. 25, 2011

(65) Prior Publication Data

US 2013/0077414 A1   Mar. 28, 2013

(51) Int. Cl.
*G11C 7/06* (2006.01)

(52) U.S. Cl.
USPC ............... 365/189.07; 365/189.05; 365/191; 365/194

(58) Field of Classification Search
USPC ........... 365/189.07, 189.05, 191, 194, 230.08
See application file for complete search history.

(56) References Cited

U.S. PATENT DOCUMENTS

| | | | |
|---|---|---|---|
| 6,473,358 B2 * | 10/2002 | Noda et al. | 365/230.06 |
| 6,757,852 B1 * | 6/2004 | Ghassemi et al. | 714/711 |
| 7,548,471 B2 * | 6/2009 | Loeffler et al. | 365/194 |
| 2003/0151437 A1 * | 8/2003 | Demone | 327/218 |

* cited by examiner

*Primary Examiner* — Toan Le
(74) *Attorney, Agent, or Firm* — Jianq Chyun IP Office

(57) ABSTRACT

A memory apparatus includes a mimic redundant device comparator, a reference delay signal generator, and a signal comparison controller. The mimic redundant device comparator is configured to receive an input signal and to delay the input signal according to a mimic delay, so as to generate a comparison signal. The reference delay signal generator is configured to receive the input signal and to delay the input signal according to a plurality of reference delays, so as to generate a plurality of reference delay signals. The signal comparison controller is configured to receive the reference delay signals and the comparison signal. According to a time difference between the comparison signal and the reference delay signals, the signal comparison controller is configured to generate a selected signal and to generate a delay control signal according to the selected signal.

12 Claims, 4 Drawing Sheets

MEMORY APPARATUS

BACKGROUND

The present application relates to a memory apparatus. More particularly, the present application relates to a memory apparatus that can dynamically adjust an array accessing time (tAA).

With the advance of semiconductor manufacturing technologies, the memory capacity of a dynamic memory is correspondingly increasing. The dynamic memory, subject to certain circuitry dimensions, can still provide large storage space for an electronic device that is required for storing a great amount of data.

According to the related art, in order to improve the yield of the conventional dynamic memory, a certain number of normal memory cells complying with the configuration standard of the dynamic memory and a certain number of redundant memory cells are included in the dynamic memory. In the process of testing the dynamic memory, if the normal memory cells are found to be damaged, the redundant memory cells can serve to replace the damaged normal memory cells, and thereby the effective storage capacity of the dynamic memory can be retained.

A redundant device comparator is required for replacing the damaged normal memory cells with the redundant memory cells. In case of reading the data in the redundant memory cells, the required address accessing time cannot be correctly estimated because of the time delay caused by the redundant device comparator. Hence, the address accessing time can merely be obtained by simulation at the design stage. As such, if the address accessing time is overly long, the overall read/write performance of the DRAM will suffer; if the address accessing time is overly short, the erroneous action of accessing the memory apparatus is likely to occur.

SUMMARY

The present application is directed to a memory apparatus that can dynamically adjust the address accessing time.

In one embodiment, a memory apparatus that includes a mimic redundant device comparator, a reference delay signal generator, and a signal comparison controller is provided. The mimic redundant device comparator is configured to receive an input signal and to delay the input signal according to a mimic delay, so as to generate a comparison signal. The reference delay signal generator is configured to receive the input signal and to delay the input signal according to a plurality of reference delays, so as to generate a plurality of reference delay signals. The signal comparison controller is coupled to the mimic redundant device comparator and the reference delay signal generator. Here, the signal comparison controller is configured to receive the reference delay signals and the comparison signal. According to a time difference between the comparison signal and the reference delay signals, the signal comparison controller is configured to generate a selected signal and to generate a delay control signal according to the selected signal.

In one embodiment, the reference delay signal generator includes a plurality of reference delay units. The reference delay units are serially coupled between the reference delay signal generator and an input end of the reference delay signal generator configured to receive the input signal. The reference delay units are configured to respectively generate the reference delay signals.

In one embodiment, a delay time provided by each of the reference delay units is the same.

In one embodiment, each of the reference delay units is a buffer.

In one embodiment, each of the reference delay units is a D-type flip-flop. The D-type flip-flop is configured to provide the delay time according to a clock signal received by the D-type flip-flop, and the delay time is equal to a cycle of the clock signal.

In one embodiment, the signal comparison controller is configured to compare the transition edges of the comparison signal and the reference delay signals and to obtain the time difference.

In one embodiment, the signal comparison controller is configured to respectively set a plurality of identification data which identify the reference delay signals.

In one embodiment, the signal comparison controller is configured to generate the delay control signal based on an identification datum of the identification data corresponding to the selected signal.

In one embodiment, the input signal is a row address signal or a column address signal of the memory apparatus.

In one embodiment, the memory apparatus further includes a redundant device comparison delay setting unit. The redundant device comparison delay setting unit is coupled to the signal comparison controller to receive the delay control signal, and the redundant device comparison delay setting unit is configured to set an accessing time delay of accessing a redundant device of the memory apparatus based on the delay control signal.

In another embodiment, a memory apparatus includes a redundant device comparator, a mimic redundant device comparator, a reference delay signal generator, a signal source, and a signal comparison controller. The redundant device comparator produces a time delay in accessing redundant memory cells. The mimic redundant device comparator has a signal input and a comparison signal output and is configured to delay an input signal dynamically, mimicking the time delay produced by the redundant device comparator. The reference delay signal generator has a signal input and a plurality of reference delay signal outputs and is configured to delay an input signal according to a plurality of reference delays. The signal source is coupled to provide the same signal to the signal inputs of the mimic redundant device comparator and the reference delay signal generator. The signal comparison controller has inputs coupled to the comparison signal output of the mimic redundant device comparator and to the plurality of reference delay signal outputs of the reference delay signal generator.

The signal comparison controller is configured to select one reference delay signal from among a plurality of such signals provided respectively by the plurality of reference delay signal outputs. The signal comparison controller is also configured to make the selection according to a time difference between individual reference delay signals and a comparison signal provided by the comparison signal output.

Based on the above, the redundant device comparator in the memory apparatus may be duplicated to form the mimic redundant device comparator. A comparison signal is generated because of the time delay provided by the mimic redundant device comparator. The comparison signal is compared with the reference delay signals generated by the reference delay signal generator, so as to obtain the optimal time delay of the memory apparatus. Since circuits in the mimic redundant device comparator and the memory apparatus are simultaneously operated, the impact of environmental parameters (e.g., temperature, humidity, etc.) and process shift on the mimic redundant device comparator and on the redundant device comparator of the memory apparatus may be the same.

Hence, the delay control signal generated by the signal comparison controller is dynamically modulated and complies with the actual requirement.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
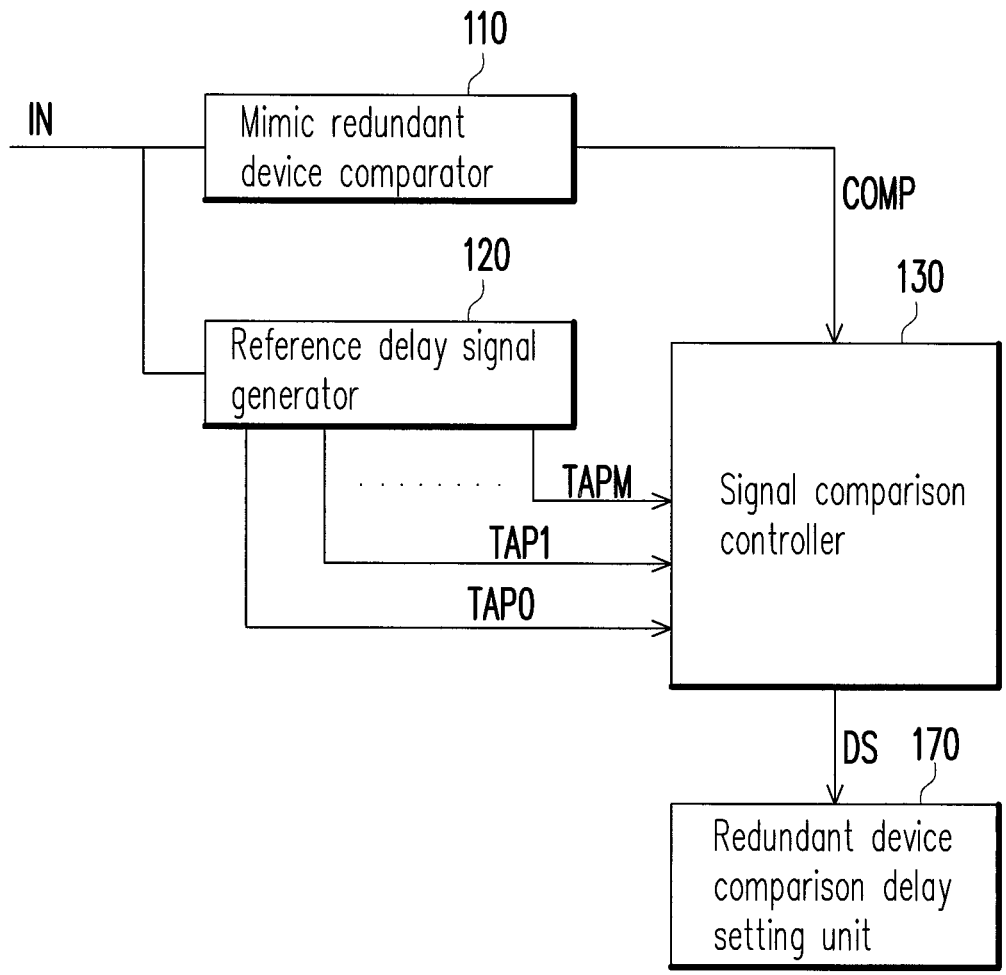
FIG. 1 is a schematic view illustrating a memory apparatus 100 according to an embodiment of the present application.

FIG. 1 is a schematic view illustrating a memory apparatus 100 according to an embodiment of the present application. The memory apparatus 100 includes a mimic redundant device comparator 110, a reference delay signal generator 120, and a signal comparison controller 130. The mimic redundant device comparator 110 receives an input signal IN and delays the input signal IN according to a mimic delay generated by the mimic redundant device comparator 110, so as to generate a comparison signal COMP. Here, one of the redundant device comparators (not shown) which is actually applied in the memory apparatus 100 and can provide the maximum delay path can be selected and can serve as the mimic redundant device comparator 110. Alternatively, one of the redundant device comparators (not shown) which is actually applied in the memory apparatus 100 and can provide the maximum delay path can be duplicated to form the mimic redundant device comparator 110. On the other hand, the input signal IN received by the mimic redundant device comparator 110 is at least one of the input signals received by the redundant device comparators that are actually applied in the memory apparatus 100. Namely, the input signal IN can be a row address signal or a column address signal.

The reference delay signal generator 120 receives the input signal IN as well. The input signal IN is input to the reference delay signal generator 120 and the mimic redundant device comparator 110 at the same time. The reference delay signal generator 120 delays the input signal IN according to a plurality of reference delays, so as to generate a plurality of reference delay signals TAP0 to TAPM. Specifically, the reference delays generated by the reference delay signal generator 120 are assumed to be 100 picoseconds, 200 picoseconds, and 300 picoseconds, or binary weighted 100, 200, 400, 800 picoseconds, respectively. The reference delay signal generator 120 can delay the input signal IN according to the 100 picoseconds reference delay, the 200 picoseconds reference delay, and the 300 picoseconds reference delay, so as to generate the reference delay signals TAP0, TAP1, and TAP2. That is to say, the reference delay signal TAP0 is equal to the signal generated by delaying the input signal IN for 100 picoseconds, the reference delay signal TAP1 is equal to the signal generated by delaying the input signal IN 200 picoseconds, and the reference delay signal TAP2 is equal to the signal generated by delaying the input signal IN for 300 picoseconds.

The signal comparison controller 130 is coupled to the mimic redundant device comparator 110 and the reference delay signal generator 120. The signal comparison controller 130 receives the comparison signal COMP from the mimic redundant device comparator 110 and receives the reference delay signals TAP0 to TAPM from the reference delay signal generator 120. According to a time difference between the comparison signal COMP and the reference delay signals TAP0 to TAPM, the signal comparison controller 130 generates a selected signal and generates a delay control signal DS according to the selected signal. In particular, the signal comparison controller 130 respectively calculates the time difference of the reference delay signals TAP0 to TAPM and the comparison signal COMP. The reference delay signal with the minimum or the sub-minimum time difference is selected and serves as the selected signal. According to the reference delay between the selected signal and the input signal IN, the signal comparison controller 130 generates the delay control signal DS.

If the signal comparison controller 130 sets the reference delay signal TAP3 as the selected signal, and the reference delay signal TAP3 is generated by delaying the input signal IN for 100 picoseconds, the signal comparison controller 130 generates the delay control signal DS that denotes the 100 picoseconds reference delay. Here, the delay control signal DS can be a binary number of 100 or any other logic numeral that can clearly indicate the 100 picoseconds reference delay.

In some embodiments, the memory apparatus 100 further includes a redundant device comparison delay setting unit 170. The redundant device comparison delay setting unit 170 is coupled to the signal comparison controller 130 and sets an accessing time delay of accessing a redundant device of the memory apparatus 100 based on the delay control signal DS received by the redundant device comparison delay setting unit 170.

The delay control signal DS can be applied for setting the delay time of accessing the redundant device in the process of testing the memory apparatus 100.

Figure 2A:
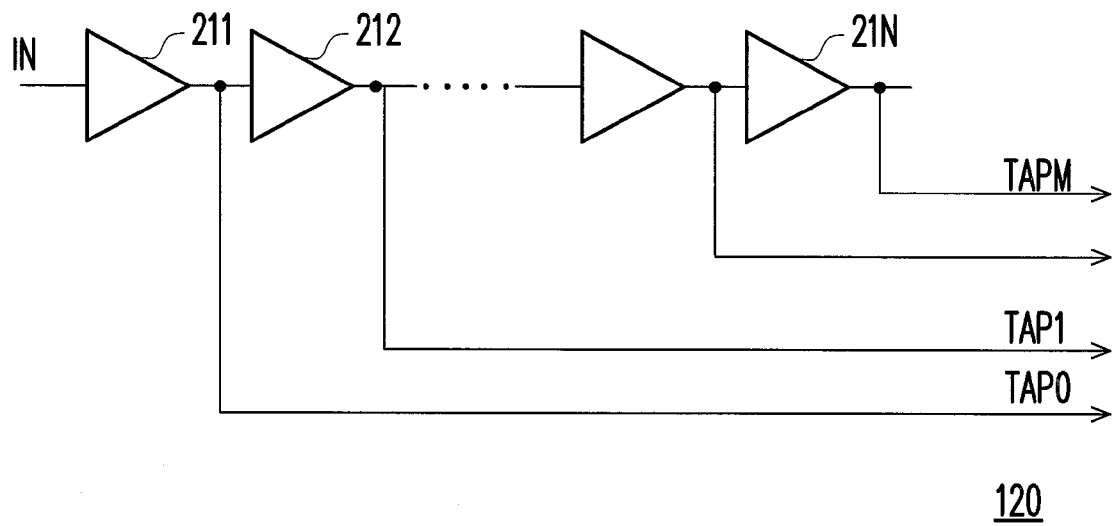
FIG. 2A and FIG. 2B respectively illustrate different examples of a reference delay signal generator 120 according to an embodiment of the present application.
Figure 2B:
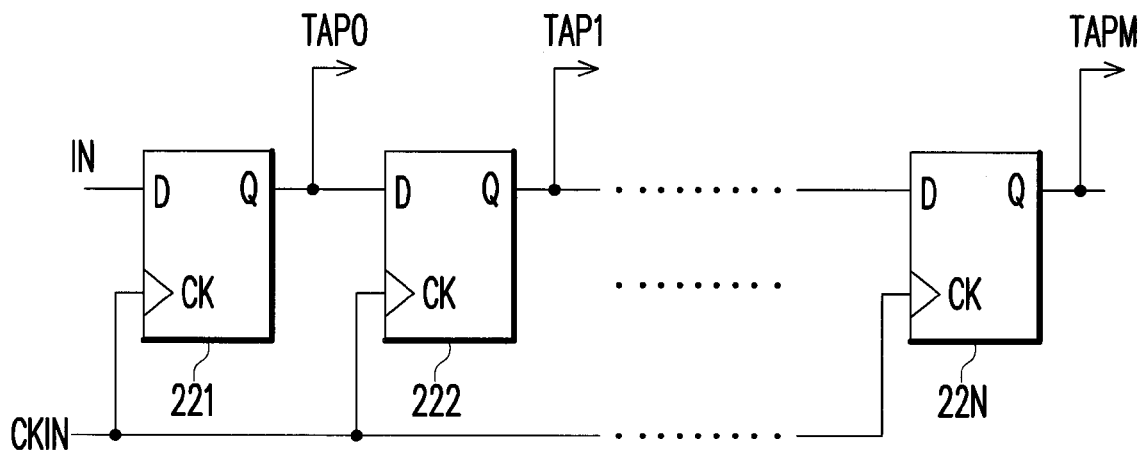

FIG. 2A and FIG. 2B respectively illustrate different examples of the reference delay signal generator 120 according to an embodiment of the present application. As indicated in FIG. 2A and FIG. 2B, the reference delay signal generator 120 is constituted by a plurality of serially-connected reference delay units. The reference delay signal generator 120 shown in FIG. 2A has buffers 211 to 21N that act as the reference delay units. The first buffer 211 receives the input signal IN and generates the reference delay signal TAP0. The output end of each of the buffers 211 to 21N is coupled to the input end of the next buffer. The output end of each of the buffers 212 to 21N respectively generates the reference delay signals TAP1 to TAPM.

According to this embodiment, the delay time provided by each of the buffers 211 to 21N can be the same or different. The buffers 211 to 21N can be one or more flip-flops. Since the design of the buffers 211 to 21N is known to people having ordinary skill in the art, no further descriptions are given below.

The reference delay signal generator 120 shown in FIG. 2B has D-type flip-flops 221 to 22N that act as the reference delay units. Each of the D-type flip-flops 221 to 22N has a clock end CK, a data end D, and an output end Q. The clock ends CK of the D-type flip-flops 221 to 22N receive a clock signal CKIN, and the output end of each of the D-type flip-flops 221 to 22N is coupled to the data end of each of the next D-type flip-flops.

Thereby, the input signal IN is sequentially propagated through the D-type flip-flops 221 to 22N, and one period of the clock signal CKIN is delayed in each D-type flip-flop stage. Based on the above-mentioned cycle, the reference delay signals TAP0 to TAPM are sequentially generated.

In the reference delay signal generator 120 shown in FIG. 2B, as long as the cycle of the clock signal CKIN remains stable, the delay correlation between the input signal IN and each of the reference delay signals TAP0 to TAPM can be accurately controlled.

Figure 3:
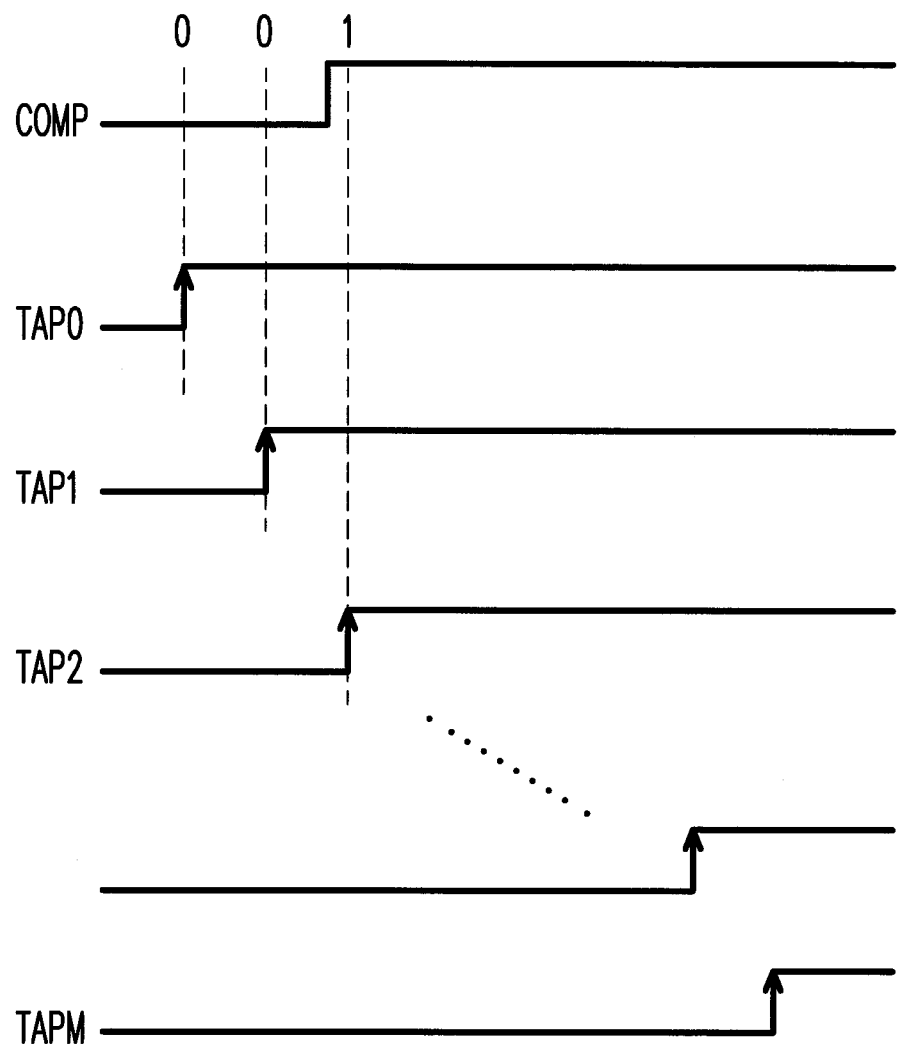
FIG. 3 is a schematic view illustrating the operation of a signal comparison controller 130 according to an embodiment of the present application.

FIG. 3 is a schematic view illustrating the operation of the signal comparison controller 130 according to an embodiment of the present application. Here, the signal comparison controller 130 compares the time at which the comparison signal COMP has a transition edge with the time at which each of the reference delay signals TAP0 to TAPM has a transition edge, and the signal comparison controller 130 generates the selected signal based on the time difference. In this embodiment, the signal comparison controller 130 generates the selected signal by sampling the comparison signal COMP with use of the reference delay signals TAP0 to TAPM. As indicated in FIG. 3, the signal comparison controller 130 samples the comparison signal COMP according to the rising edge of each of the reference delay signals TAP0 to TAPM. When the signal comparison controller 130 samples the comparison signal COMP with use of the reference delay signal TAP0, the sampling result is 0; when the signal comparison controller 130 samples the comparison signal COMP with use of the reference delay signal TAP1, the sampling result is 0 as well; when the signal comparison controller 130 samples the comparison signal COMP with use of the reference delay signal TAP2, the sampling result is 1. Based on said sampling results, the transition of the comparison signal COMP occurs between the rising edges of the reference delay signals TAP1 and TAP2. Therefore, the delay signal closest to the comparison signal COMP is the delay signal TAP1 or the delay signal TAP2.

Figure 4:
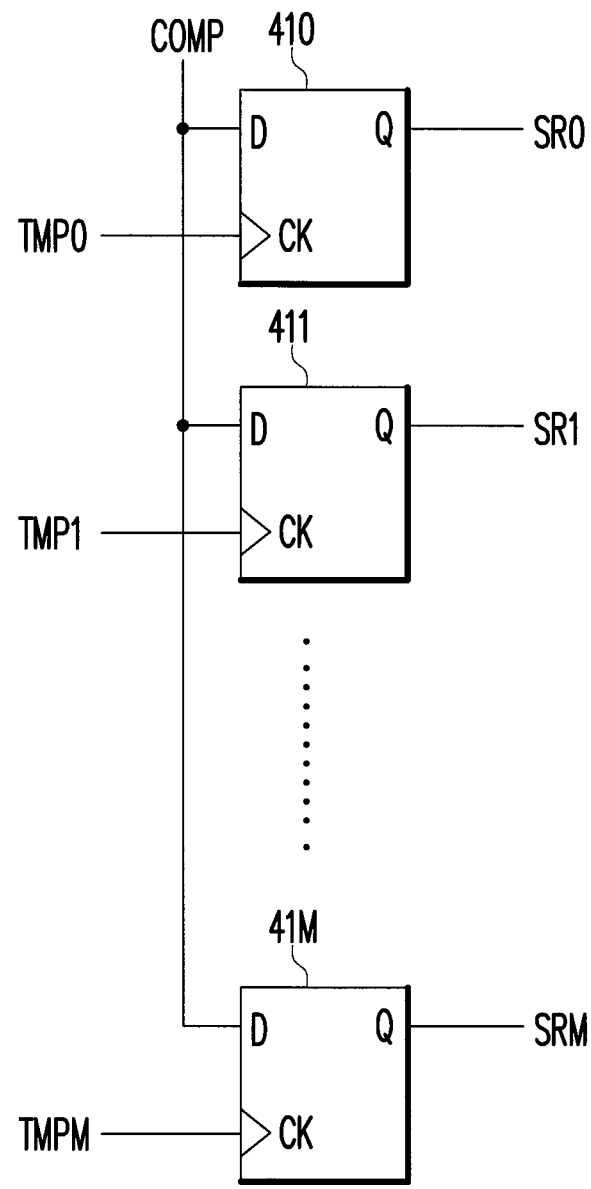
FIG. 4 schematically illustrates some circuits in the signal comparison controller 130 according to an embodiment of the present application.

FIG. 4 schematically illustrates some circuits in the signal comparison controller 130 according to an embodiment of the present application. The signal comparison controller 130 includes D-type flip-flops 410 to 41M. Each of the D-type flip-flops 410 to 41M has a clock end CK, a data end D, and an output end Q. The comparison signal COMP is transmitted to the data ends D of the D-type flip-flops 410 to 41M for further sampling. The reference delay signals TAP0 to TAPM are respectively input to the clock ends CK of the D-type flip-flops 410 to 41M, so as to respectively sample the comparison signal COMP. The sampling results SR0 to SRM are shown at the output ends Q of the D-type flip-flops 410 to 41M. Based on the sampling results SR0 to SRM, the signal comparison controller 130 can select the appropriate selected signal from the delay signals TAP0 to TAPM.

In order for the signal comparison controller 130 to generate the delay control signal DS, the signal comparison controller 130 can set a plurality of identification data identifying the reference delay signals TAP0 to TAPM, respectively. After the signal comparison controller 130 selects the selected signal, the signal comparison controller 130 can generate the delay control signal DS based on an identification datum of the identification data corresponding to the selected signal.

In the example shown in FIG. 3, the signal comparison controller 130 sets the identification data of the reference delay signals TAP0 to TAPM as 0 to M, respectively. In addition, the signal comparison controller 130 selects the reference delay signal TAP2 as the selected signal based on the sampling results. The identification datum corresponding to the reference delay signal TAP2 is 2. Therefore, the signal comparison controller 130 can generate the delay control signal DS based on the identification datum that is equal to 2 (e.g., the logic value of the delay control signal DS can be set as 2).

Note that the delay control signal DS that is equal to 2 can indicate the reference delay of the reference delay signal TAP2 (e.g., equal to 2×100=200 picoseconds). Namely, the delay between the input signal IN and the comparison signal COMP is approximately equal to 200 picoseconds.

In light of the foregoing, the comparison signal generated by the mimic redundant device comparator is applied to simulate the time delay caused by the redundant device comparators that are actually applied in the memory apparatus. After the reference delays provided by the reference delay signal generator are compared, the most appropriate delay control signal can be dynamically calculated. As such, the address accessing time of the memory apparatus can be effectively and dynamically adjusted, and the efficacy of the memory apparatus can be improved as a whole.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory apparatus comprising:
   a mimic redundant device comparator configured to receive an input signal, to delay the input signal according to a mimic delay, and to generate a comparison signal;
   a reference delay signal generator configured to receive the input signal, to delay the input signal according to a plurality of reference delays, and to generate a plurality of reference delay signals; and
   a signal comparison controller coupled to the mimic redundant device comparator and the reference delay signal generator, the signal comparison controller being configured to receive the reference delay signals and the comparison signal, to generate a selected signal according to a time difference between the comparison signal and the reference delay signals, and to generate a delay control signal according to the selected signal.

2. The memory apparatus as recited in claim 1, wherein the reference delay signal generator comprises a plurality of reference delay units, the reference delay units being serially coupled between the reference delay signal generator and an input end of the reference delay signal generator configured to receive the input signal, and the reference delay units respectively being configured to generate the reference delay signals.

3. The memory apparatus as recited in claim 2, wherein a delay time provided by each of the reference delay units is the same.

4. The memory apparatus as recited in claim 3, wherein each of the reference delay units is a buffer.

5. The memory apparatus as recited in claim 3, wherein each of the reference delay units is a D-type flip-flop, the D-type flip-flop configured to provide the delay time according to a clock signal received by the D-type flip-flop, and the delay time being equal to a cycle of the clock signal.

6. The memory apparatus as recited in claim 1, wherein the signal comparison controller is configured to generate the selected signal based on a time difference obtained by comparing a time at which the comparison signal has a transition edge with a time at which each of the reference delay signals has a transition edge.

7. The memory apparatus as recited in claim 1, wherein the signal comparison controller is configured to respectively set a plurality of identification data identifying the reference delay signals.

8. The memory apparatus as recited in claim 7, wherein the signal comparison controller is configured to generate the delay control signal based on an identification datum of the identification data corresponding to the selected signal.

9. The memory apparatus as recited in claim 1, wherein the input signal is a row address signal or a column address signal of the memory apparatus.

10. The memory apparatus as recited in claim 1, further comprising:
  a redundant device comparison delay setting unit coupled to the signal comparison controller to receive the delay control signal, the redundant device comparison delay setting unit being configured to set an accessing time delay for accessing a redundant device of the memory apparatus based on the delay control signal.

11. A memory apparatus operating method comprising:
  a mimic redundant device comparator receiving an input signal, delaying the input signal according to a mimic delay, and generating a comparison signal;
  a reference delay signal generator receiving the input signal, delaying the input signal according to a plurality of reference delays, and generating a plurality of reference delay signals; and
  a signal comparison controller coupled to the mimic redundant device comparator and the reference delay signal generator, the signal comparison controller receiving the reference delay signals and the comparison signal, generating a selected signal according to a time difference between the comparison signal and the reference delay signals, and generating a delay control signal according to the selected signal.

12. A memory apparatus comprising:
  a redundant device comparator that produces a time delay in accessing redundant memory cells;
  a mimic redundant device comparator having a signal input and a comparison signal output and being configured to delay an input signal dynamically, mimicking the time delay produced by the redundant device comparator;
  a reference delay signal generator having a signal input and a plurality of reference delay signal outputs and being configured to delay an input signal according to a plurality of reference delays;
  a signal source coupled to provide the same signal to the signal inputs of the mimic redundant device comparator and the reference delay signal generator; and
  a signal comparison controller having inputs coupled to the comparison signal output of the mimic redundant device comparator and to the plurality of reference delay signal outputs of the reference delay signal generator, the signal comparison controller being configured to select one reference delay signal from among a plurality of such signals provided respectively by the plurality of reference delay signal outputs, the signal comparison controller being also configured to make the selection according to a time difference between individual reference delay signals and a comparison signal provided by the comparison signal output.

* * * * *